United States Patent
Dona et al.

[11] Patent Number: 5,971,628
[45] Date of Patent: Oct. 26, 1999

[54] HOLDER FOR OPTOELECTRONIC DEVICE HAVING CONNECTION PINS BENT TOWARD A CONNECTION MEANS

[75] Inventors: Marinus J. J. Dona; Doeke J. Oostra; Remigius S. M. Van Roemburg; Jakob Vijfvinkel, all of Eindhoven, Netherlands

[73] Assignee: JDS Uniphase Corporation, San Jose, Calif.

[21] Appl. No.: 08/953,710

[22] Filed: Oct. 17, 1997

[30] Foreign Application Priority Data

Oct. 23, 1996 [EP] European Pat. Off. .............. 96202958

[51] Int. Cl.$^6$ ....................................................... G02B 6/36
[52] U.S. Cl. ................................................ 385/88; 385/92
[58] Field of Search ........................................ 385/88–94

[56] References Cited

U.S. PATENT DOCUMENTS

| | | | |
|---|---|---|---|
| 5,113,466 | 5/1992 | Acarlar et al. ............................. | 385/88 |
| 5,127,073 | 6/1992 | Mulholland et al. ...................... | 385/92 |
| 5,604,831 | 2/1997 | Dittman et al. ............................ | 385/88 |
| 5,784,513 | 7/1998 | Kuribayashi et al. ..................... | 385/88 |
| 5,812,717 | 9/1998 | Gilliland ................................... | 385/88 |

FOREIGN PATENT DOCUMENTS 7-056058  3/1995  Japan .

*Primary Examiner*—Hemang Sanghavi
*Attorney, Agent, or Firm*—Michael A. Glenn

[57] ABSTRACT

The invention provides an optoelectronic device having a holder and a coaxial module which is secured in the holder and which includes an optoelectronic component, preferably a semi-conductor diode laser. The module is capable of receiving or emitting radiation at an end face of the module, preferably via a coupled glass fiber. Connection pins for the optoelectronic component are situated at the other end face of the module and the holder is provided with connection means which extended right angles to the longitudinal direction of the module and that are electrically connected to the connection pins. The connection pins are bent from the longitudinal direction of the module towards the connection means. The free ends of the connection pins are inserted in the connection means. The holder is provided with a clamping member by means of which the module is secured in the holder. The clamping member is constructed in such a manner that the module can be placed in the clamping member of the holder in a direction at right angles to the longitudinal direction of the module.

17 Claims, 3 Drawing Sheets

HOLDER FOR OPTOELECTRONIC DEVICE HAVING CONNECTION PINS BENT TOWARD A CONNECTION MEANS

BACKGROUND OF THE INVENTION

1. Field of the Invention

The invention relates to an optoelectronic device comprising a holder and a coaxial module which is secured in said holder and which includes an optoelectronic component, preferably a semiconductor diode laser, which module is capable of receiving or emitting radiation at an end face of said module, preferably via a coupled glass fiber, with connection pins for the optoelectronic component being situated at the other end face of the module, and the holder being provided with connection means which extend at right angles to the longitudinal direction of the module and which are electrically connected to the connection pins. Such a device is used, for example, in a system for fiber optics communication.

2. Description of the Prior Art

Such a device is known from JP-A-07056058, published on Mar. 3, 1995 (Patent Abstract of Japan, CD-ROM, Jul. 31, 1995–6[006]). In said publication, a device is shown having a module which comprises a laser and which is secured in a box-shaped holder. The module is provided, at an end, with a glass fiber which projects from the box and, at the other end, with connection pins which are situated inside the box. The module is secured in a side wall of the box and the bottom side of the box is provided with connection means extending at right angles to the longitudinal direction of the module and being electrically connected to the connection pins. Connection means can be used to secure the device to a printed circuit board so that the module and the glass fiber are parallel to the printed circuit board. Such an assembly is very compact and enables the module and the holder to be manufactured separately.

A disadvantage of the known device is that it is relatively expensive because the holder is relatively complex. It is also relatively difficult to secure the module in the holder.

SUMMARY OF THE INVENTION

It is an object of the invention to obtain a device of the type mentioned in the opening paragraph, in which the above-mentioned drawbacks are overcome or at least substantially reduced and which comprises a simple holder in which the module can be readily secured.

To achieve this, a device of the type mentioned in the opening paragraph is characterized, in accordance with the invention, in that the connection pins are bent from the longitudinal direction of the module towards the connection means, the free ends of the connection pins are inserted in the connection means, the holder is provided with a clamping member by means of which the module is secured in the holder, and said clamping member is constructed in such a manner that the module can be placed in the clamping member of the holder in a direction at right angles to the longitudinal direction of the module.

The fact that the connection pins are bent towards the connection means and inserted in said connection means results in a simplification of the mounting process: an additional electric connection, such as a wire connection, can be dispensed with. By virtue of the presence of a clamping member in the holder, the module can be readily secured in said holder. As the clamping member is constructed so that the module can be arranged in said clamping member in a direction at right angles to its longitudinal direction, securing the module in the holder is not hampered by the curved state of the connection pins. By virtue of these cooperating measures, the device in accordance with the invention can be manufactured readily and in a simple manner. Before the module is secured in the holder, the connection pins of the module extend in the longitudinal direction of the module. An important additional advantage of the device in accordance with the invention is that bending of the connection pins, which is necessary for the invention, can be achieved in a simple manner by inserting the module with the connection pins in the connection means and, subsequently, moving the module in the direction of the clamping member towards the holder, thereby causing bending of the connection pins. In this manner, electrically connecting and mechanically bending the connection pins as well as arranging and securing the module in the holder can take place, as it were, in one, continuous operation. This operation does not require additional tools, such as pliers. This aspect contributes essentially to the simplification of the device and its manufacture. The connection means are, for example, metal tubes in which the connection pins are inserted.

In a preferred embodiment of a device in accordance with the invention, the connection means comprise apertures in a wall of the holder through which the free ends of the bent connection pins project beyond the holder. This results in a further simplification of the device and its manufacture. By virtue thereof, the free ends of the connection pins can be secured directly, for example, to a printed circuit board. The bending point of the connection pins is situated at the upper side of the apertures. An important advantage is that if a soldered joint is used to secure said free ends of the connection pins, it is situated at a relatively large distance from the module and from soldered joints contained therein, for example those formed to secure the laser.

As a result, the last-mentioned soldered joints do not have to be made with a solder having a high(er) temperature. Besides, the quality of the module, for example the quality of the alignment of the laser and the glass fiber, is in itself very favorably influenced already if said module is (almost) not heated.

In a very important variant, the device also comprises guide means which control the bending of the connection pins, more particularly the location of the bending point, and which preferably form part of the holder. By virtue thereof, the manufacture is further facilitated and excessive deformation of the connection pins or even contact between the pins during bending, which would cause undesirable mechanical stresses in the module, is prevented. The guide means are provided, for example, with weakened portions in the connecting pins, for example indentations. These indentations must be situated in the connection pins, approximately at the location of the desired bending point. Preferably, however, the guide means form part of the holder and comprise, for example, curved channels in the holder which also form the connection means.

In a very attractive variant, the guide means comprise a stepped profile, which forms part of the holder, extends downward in the direction of the module and comprises at least two steps, the height of a step corresponding approximately to the distance between two connection pins. In this case, the connection means, preferably in the form of straight, channel-like apertures, are situated in the upper side of the steps, and the holder still is very simple in shape and easy to manufacture. When the, as yet, unbent connection pins are situated above the stepped profile, the connection pins are inserted step by step, i.e. not simultaneously, into the connection means. This is an additional advantage. In practice, the module often has two, three or four connection pins, which form part of a standard foot, such as a TE (=Transistor Envelope) foot. All this is connected with the possible presence of a monitor diode in the module and with the way of connecting the laser and the monitor diode. If two or three connection pins are employed, then, in a favorable variant of the device, every connection pin is inserted into a separate step of the stepped profile, and the module can be placed sideways in the clamping member. The advantage of this variant resides in that the connection pins can be arranged in line and, for example, along the edge of a printed circuit board, which may sometimes be desirable. This is easier if the module is placed sideways in the clamping member. In the case of three or four connection pins, another favorable variant can alternatively be applied. In this variant, two connection pins are inserted in a first step and the remaining connection pin(s) is (are) inserted in a second step, and the module can be placed in the clamping member from above.

Preferably, the holder has a flat bottom side from which the connection pins project, and the clamping member comprises a groove which is provided in the upper side or a side face of the holder and which is C-shaped or U-shaped in cross-section. Preferably, an outer surface of the module is provided with information which is situated on the part of the circumference of the module which is not hidden from view by the clamping member. By thus providing the module with information, for example with respect to origin, type number or serial number, production date, etc., this information is still legible after the module has been arranged in the holder. As a result, the holder does not have to be provided with said information. Preferably, the holder further comprises one or more projections which serve as a securing means or a pull-relief means and which run parallel to the connection means and preferably include a pin which is secured in recesses or apertures in the (wall of the) holder. The device may also advantageously comprise a printed circuit board on which the holder containing the module is mounted.

In a very important embodiment, the holder comprises a single synthetic resin body, which is preferably manufactured by injection moulding. This enables large numbers of the entire holder to be manufactured in a simple and inexpensive manner. It may also be very attractive sometimes to provide further (opto-)electronic components, including passive components, on the holder. An example of such a component which can suitably be used for certain applications is a coil.

The invention also relates to a holder which can suitably be used in an optoelectronic device in accordance with the invention, which holder is provided with a clamping member in which a coaxial module can be placed at right angles to its longitudinal direction and which comprises connection means, preferably in the form of tubular apertures in the holder, which extend perpendicularly to the longitudinal direction of the module. The holder may also be provided with further (opto)electronic components and/or a printed circuit board. The invention further relates to a method of manufacturing an optoelectronic device having a coaxial module which comprises an optoelectronic component, preferably a semiconductor diode laser, which module passes radiation at one end face, preferably via a glass fiber, and which is provided with connection pins at the other end face, and which is secured to a holder provided with connection means by means of a clamping member which forms part of said holder, with the connection pins of the module being connected to the connection means of the holder, characterized in that the free end of the connection pins is inserted into the connection means, the connection pins are bent through approximately 90 degrees, and the module is placed in the clamping member from a direction at right angles to its longitudinal direction. Preferably, the connection means are constructed as apertures in the holder, the free end of the connection pins is inserted into the apertures prior to bending of the connection pins, and, subsequently, the module is bent through approximately 90 degrees towards the holder, thereby causing bending of the connection pins and, finally, the module is arranged in the clamping member.

These and other aspects of the invention will be apparent from elucidated with reference to the embodiments described hereinafter.

BRIEF DESCRIPTION OF THE DRAWINGS

In the drawings.

The Figures are purely schematic and not drawn to scale. Corresponding parts generally bear the same reference numerals.

DESCRIPTION OF THE PREFERRED EMBODIMENTS

Figure 1:
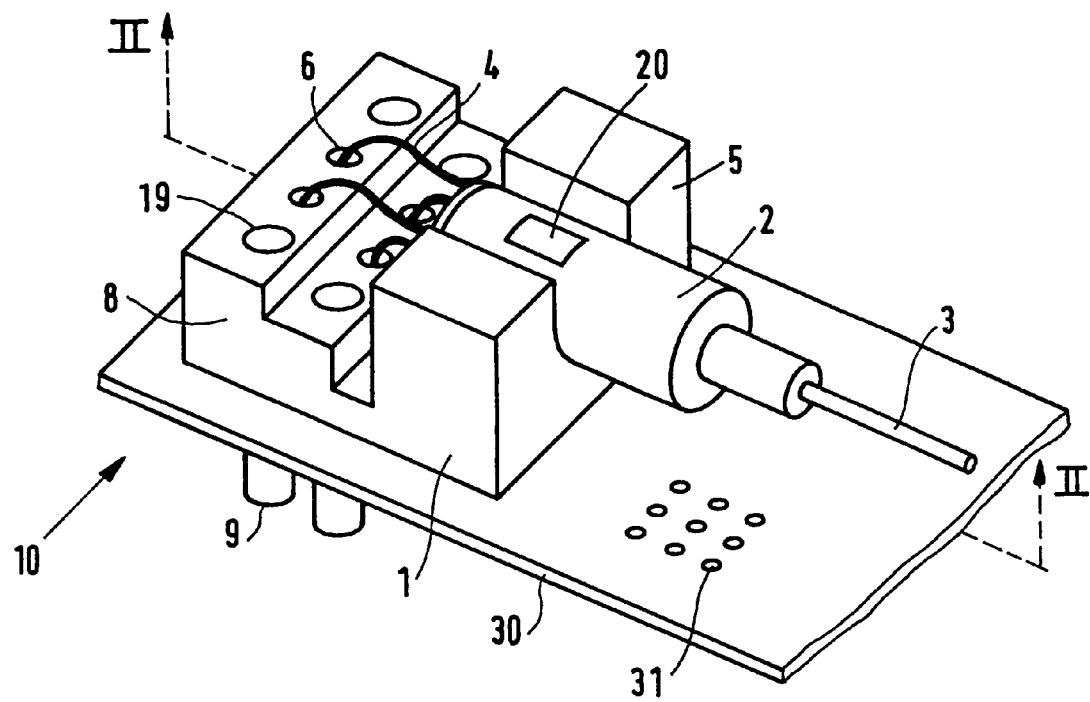
FIG. 1 is a schematic, perspective view of an embodiment of an optoelectronic device in accordance with the invention.
Figure 2:
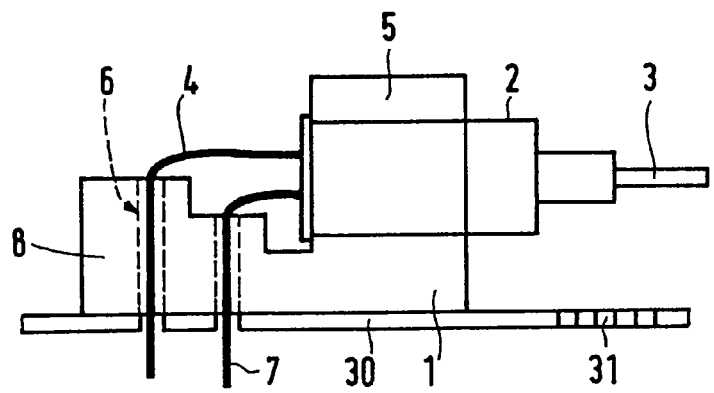
FIG. 2 is a schematic, cross-sectional view parallel to the longitudinal direction of the device shown in FIG. 1.

FIG. 1 is a schematic, perspective view of an optoelectronic device 10 in accordance with the invention. FIG. 2 is a schematic, cross-sectional view parallel to the longitudinal direction of the device 10 shown in FIG. 1. Said device 10 comprises a holder 1 and a coaxial module 2, which is secured in said holder and which comprises an optoelectronic component, in this case a laser. At an end face of the module 2 there is an optical glass fiber 3 which is arranged in line with the laser, so that the module 2 can receive or emit radiation. At the other end face of the module 2 there are connection pins 4, in this case four, which are electrically connected to the laser and, possibly, other components, such as a monitor diode within the module 2. The construction of the module 2 corresponds to that shown, for example, in EPA 89201390.5, published under No. 0.345.874 on Dec. 12, 1989. The holder 1 is provided with connection means 6 which extend at right angles to the longitudinal direction of the module 2 and which are electrically connected to the connection pins 4.

In accordance with the invention, the connection pins 4 are bent from the longitudinal direction of the module 2 towards the connection means 6, the free ends 7 of the connection pins 4 are inserted into the connection means 6, and the holder 1 is provided with a clamping member 5 by means of which the module 2 is secured to the holder 1, said clamping member being constructed so that the module 2 can be placed therein in a direction at right angles to the longitudinal direction of the module 2. On the one hand, this construction renders an additional (electric) connection between the connection pins 4 and the connection means 6 superfluous, on the other hand, the clamping member 5 and the construction thereof enable the module to be secured to the holder 1 despite the fact that the connection pins 4 are bent. By virtue thereof, the device 10 in accordance with the invention can be manufactured in a simple and inexpensive manner. In this respect, it is important that the necessary bending of the connection pins 4, which customarily extend in the longitudinal direction of the module 2, can be effected in a simple manner in the device 10 itself, without additional tools and without a separate manufacturing step; after all, the connection pins 4 of the module 2 can be inserted into the connection means 6 of the holder 1, whereafter the module 2 is bent towards the holder 1 and arranged in the clamping member 5.

In this example, the connection means 6 of the device 10 comprise apertures 6 in a wall of the holder 1, through which the connection pins 4, comprising gold-plated steel, project beyond the holder 1. The free ends 7 of the connection pins 4 are connected, in this example, to a printed circuit board 30 provided with metallized apertures 31. By virtue thereof, the device 10 and its manufacture are further simplified. As in this example, the device 10 preferably comprises connection means 8 which control the bending of the connection pins 4 and, preferably, form part of the holder 1. In this example, the connection means 8 comprise a stepped profile 8 which forms part of the holder 1 and which descends towards the module 2, the connection pins 4 being inserted into the upper side of the steps of the stepped profile 8. In this example, the profile 8 comprises two steps in each of which two apertures 6 are formed into which the four connection pins 4 of the module 2 are inserted. An additional advantage of such a stepped profile 8 resides in that, when the module 2 with the still straight connection pins 4 is inserted in the holder 1, it is not necessary to simultaneously insert all connection pins into the apertures 6. The most important advantage of such a construction is that, after all connection pins 4 are inserted into the holder 1, these connection pins can be bent in a controlled manner by bending the module towards the holder 1. On this account, the difference in height between two steps is approximately equal to the distance between two connection pins 4. In this manner, an adequate bending of the connection pins 4 is achieved, while the stress in the connection pins 4 or in the module 2 is minimized, and the risk of a short circuit is minimal. In the present example, this construction enables the module 2 to be introduced into the clamping member 5 from above.

In this case, the holder 1 has a flat bottom side which is supported by the printed circuit board 30, and the clamping member 5 comprises a C-shaped or U-shaped groove. The outer surface of the module 2 is provided with information 20, including, in this case, a logo, a type number and a serial number, which is provided at such a location on the sleeve of the module 2 that it is visible after the module 2 has been arranged in the holder 1. By virtue thereof, this information does not have to be provided on the outer surface of the holder. In this example, the holder 1 of the device 10 consists of a single body 1 of a synthetic resin, comprising, in this case, PTFE (=Poly Tetra Fluoro Ethylene), and is manufactured by injection moulding. By virtue thereof, the cost of the device and of its manufacture are further reduced. In this case, the holder 1 further comprises (see FIG. 1) projections 9 in the form of pins 9, which are arranged in relevant apertures 19 of the holder 1 which, just like the connection pins 4, are secured in apertures 31 in the printed circuit board 30. These projections 9 fix the holder 1 relative to the printed circuit board 30 and, in this case, also serve as means for fixing the holder 1 to the printed circuit board 30. As a result, the mechanical load on the connection between the connection pins 4 and the printed circuit board 30 is small or perhaps even nil.

Just like the distance between two connection means 6, the distance between two projections 9 is chosen to be such that it is an integral number of times greater than the pitch between the wholes of the pattern 31 in the printed circuit board 30. The dimensions (w×l×h) of the holder 1 are approximately 12×13×8 mm$^3$. The internal diameter of the clamping member 5 is 5 mm and the center line thereof is situated 5.75 mm above the bottom side of the holder 1. The apertures 6, 19 have a diameter, respectively, of 0.7 and 1.6 mm and the distance between them is 2.5 mm. The steps of the profile 8 have a height, respectively, of 5.5 and 4.0 mm, measured from the bottom side of the holder 1. The apertures 6, 19 are at a distance, respectively, of 2.75 and 2.75+2.5 mm from the clamping member 5, which has a length of 5.25 mm. In this case, the holder 1 is fabricated as a separate (intermediate) product and, as such, forms part of the present invention.

Figure 3:
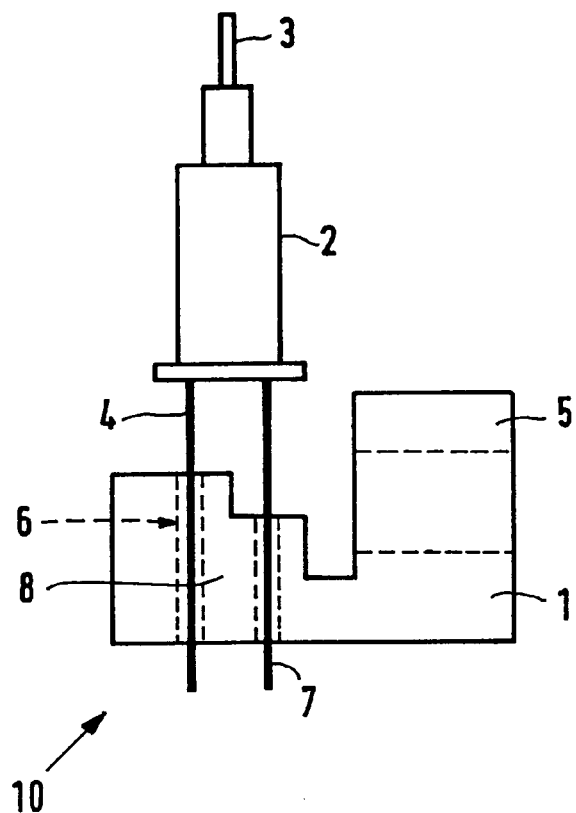
FIGS. 3 through 5 are schematic, cross-sectional views, parallel to the longitudinal direction of the device shown in FIG. 1, of successive manufacturing stages in which a method in accordance with the invention is employed.
Figure 4:
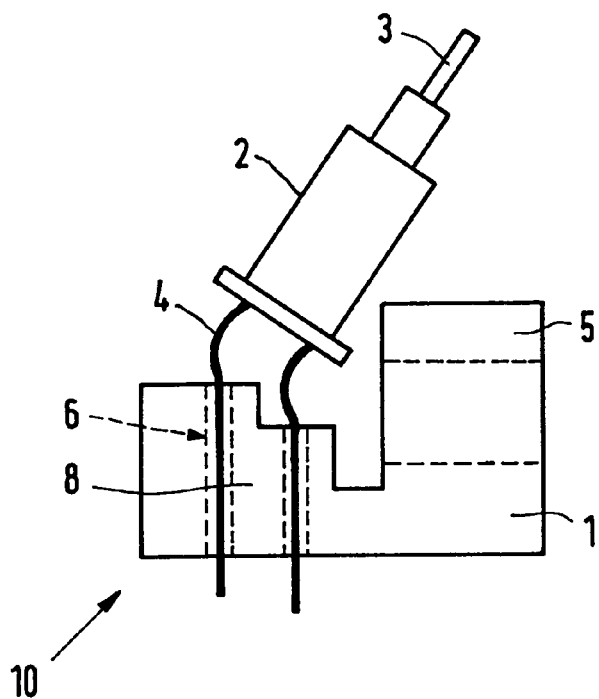
Figure 5:
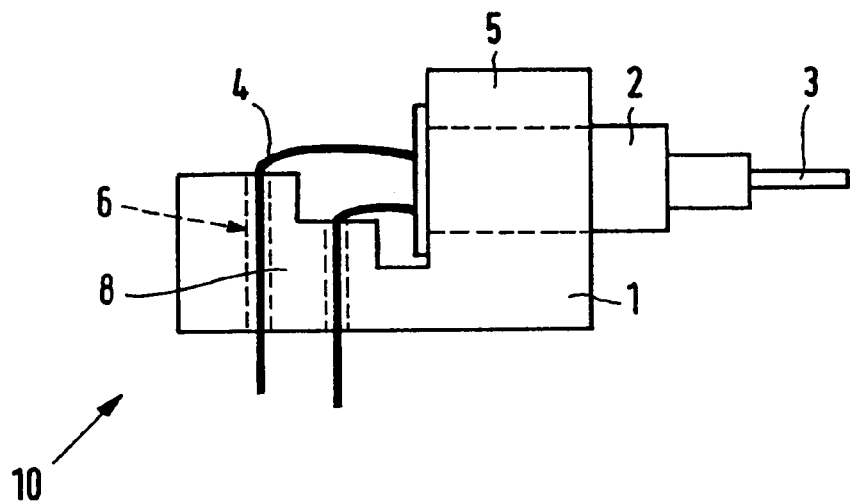

FIGS. 3 through 5 are schematic, cross-sectional views, parallel to the longitudinal direction, of the device 10 of FIG. 1 in successive stages of the manufacturing process, which is carried out by means of a method in accordance with the invention. First, the module 2 is inserted into the holder 1, as shown in FIG. 3. In this operation, first, the free ends 7 of the connection pins 4 situated on the left in the drawing are inserted into the upper step of the stepped profile 8, and, subsequently, the free ends of the connection pins 4 situated on the right in the drawing are inserted into the lower step. The connection pins 4 are inserted so far into the apertures 6 that the free ends 7 thereof project from the bottom side of the holder 1. Subsequently, (see FIG. 4) the module 2 is bent towards the holder 1 in the direction of the clamping member 5. In this operation, the connection pins 4 are bent, with the stepped profile 8 serving as a guide means. Next, (see FIG. 5) the module 2 is arranged and secured in the clamping member 5. Subsequently, (see FIG. 1) the holder 1 is secured via projections 9 in apertures 31 of a printed circuit board 30. In this operation, also the connection pins 4 are inserted into apertures 31 in the printed circuit board 30 and are secured therein, for example, by means of soldering. The variant of an inventive method described herein enables the very attractive device 10 in accordance with the invention to be manufactured in a very simple manner, without additional tools and, as it were, in a single process step.

Figure 6:
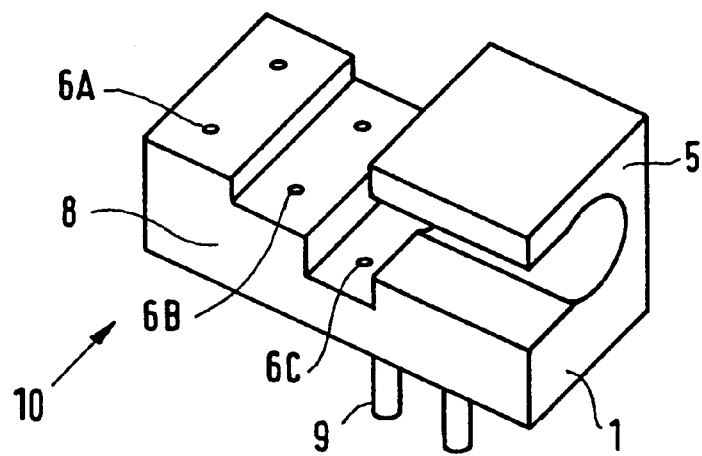
FIG. 6 is a schematic, perspective view of a variant of the holder of the device shown in FIG. 1.

Finally, FIG. 6 is a schematic, perspective view of a variant of the holder 1 of the device 10 shown in FIG. 1. The most important differences with respect to the holder 1 described hereinabove are: three instead of two steps of the stepped profile 8 are provided with apertures 6, and the module 2 can be placed in the clamping member 5 from the side, not from above. This variant can suitably be used, for example, for a module having three connection pins which are preferably in line with one another. To this end, one connecting pin is inserted in each one of the apertures 6A, 6B and 6C. Subsequently, the module is bent in the direction of the holder 1, in such a manner that, viewed from above, the module is situated outside the holder 1 and can be introduced sideways into the aperture of the clamping member 5.

The invention is not limited to the above-described example and the variant thereof since many modifications and variations are possible to those skilled in the art. For example, materials or dimensions other than those mentioned in the example can be used. In particular, it is noted that although the device in accordance with the invention preferably comprises a semiconductor diode laser as the optoelectronic component, the invention is not limited thereto. The device may advantageously comprise other optoelectronic components, such as a photodiode or an LED (=Light Emitting Diode). Also, the device can suitably be employed in systems other than optical communication systems, for example, optical write systems, laser printers, bar-code readers, etc. In those cases, the emission wavelength of the laser is below 1 μm, and the device, generally, does not comprise a glass fiber, but instead the module is only provided with a window.

We claim:

1. An optoelectronic device (10) comprising a holder (1) and a coaxial module (2) which is secured in said holder (1) and which includes an optoelectronic component, a semiconductor diode laser, which module (2) is capable of receiving or emitting radiation at an end face of said module (2), via a coupled glass fiber (3), with connection pins (4) for the optoelectronic component being situated at the other end face of the module (2), and the holder (1) being provided with connection means (6) which extend at right angles to the longitudinal direction of the module (2) and are electrically connected to the connection pins (4), characterized in that the connection pins (4) are bent from the longitudinal direction of the module (2) towards the connection means (6), the free ends (7) of the connection pins (4) are inserted in the connection means (6), the holder (1) is provided with a clamping member (5) by means of which the module (2) is secured in the holder (1), and said clamping member (5) is constructed in such a manner that the module (2) can be placed in the clamping member (5) of the holder (1) in a direction at right angles to the longitudinal direction of the module (2).

2. An optoelectronic device (10) as claimed in claim 1, characterized in that the connection means (6) comprise apertures (6) in a wall of the holder (1) through which the free ends (7) of the bent connection pins (4) project beyond the holder (1).

3. An optoelectronic device (10) as claimed in claim 1, characterized in that the device (10) comprises guide means (8) which control the bending of the connection pins (4) and which form part of the holder (1).

4. An optoelectronic device (10) as claimed in claim 3, characterized in that the guide means (8) comprise a stepped profile (8), which forms part of the holder, extends downward in the direction of the module (2) and comprises at least two steps in which the connection means (6) are incorporated, the height of the steps corresponding to the distance between two connection pins (4).

5. An optoelectronic device (10) as claimed in claim 4, characterized in that the module comprises two or three connection pins (4) which are each inserted into a separate step of the stepped profile (8), and in that the module (2) can be placed sideways in the clamping member (5).

6. An optoelectronic device (10) as claimed in claim 4, characterized in that the module (2) comprises three or four connection pins (4), two of which are inserted into a first step of the stepped profile (8) and the remaining connection pin(s) is (are) inserted in a second step of the stepped profile (8), and in that the module (2) can be placed in the clamping member (5) from above.

7. An optoelectronic device (10) as claimed in claim 1, characterized in that the holder (1) has a flat bottom side where the connection means (6) terminate, and the clamping member (5) has a groove (5) in the upper side or in a side face of the holder (2), which groove is C-shaped or U-shaped in cross-section.

8. An optoelectronic device (10) as claimed in claim 7, characterized in that an outer surface of the module (2) is provided with information (20) which is situated on the part of the circumference of the module (2) which is not hidden from view by the clamping member (5).

9. An optoelectronic device (10) as claimed in claim 1, characterized in that the holder (1) comprises one or more projections (9) which serve as a securing means or a pull-relief means and which run parallel to the connection means (6) and include a pin (9) which is secured in recesses or apertures (19) in the holder (1).

10. An optoelectronic device (10) as claimed in claim 1, characterized in that the holder (1) comprises a single synthetic resin body (1), which is manufactured by injection moulding.

11. An optoelectronic device (10) as claimed in claim 1, characterized in that the device (10) comprises a printed circuit board (30) on which the holder (1) containing the module (2) is secured.

12. An optoelectronic device as claimed in claim 1, characterized in that the device further comprises optoelectronic components which are situated on the holder.

13. A holder (1) which is suitable for use in an optoelectronic device (10) as claimed in claim 1, characterized in that the holder (1) is provided with a clamping member (5) in which a coaxial module can be placed at right angles to its longitudinal direction, which holder is further provided with connection means (6), in the form of apertures (6) in the holder (1), which extend at right angles to the longitudinal direction of the module (2).

14. A holder (1) as claimed in claim 13, characterized in that the holder (1) comprises further optoelectronic components.

15. A holder (1) as claimed in claim 13, characterized in that the holder (1) is provided with a printed circuit board (30).

16. A method of manufacturing an optoelectronic device (10) having a coaxial module (2) which comprises an optoelectronic component, a semiconductor diode laser, which module passes radiation at one end face, via a glass fiber (3), and which is provided with connection pins (4) at the other end face, and which is secured to a holder (1) provided with connection means (6) by means of a clamping member (5) which forms part of said holder (1), with the connection pins (4) of the module (2) being connected to the connection means (6) of the holder (1), characterized in that the free end (7) of the connection pins (4) is inserted into the connection means (6), the connection pins (4) are bent through approximately 90 degrees, and the module (2) is placed in the clamping member (5) from a direction at right angles to its longitudinal direction.

17. A method as claimed in claim 16, characterized in that the connection means (6) are constructed as apertures (6) in the holder (1), the free end (7) of the connection pins (4) is inserted into the apertures (6) prior to bending of the connection pins (4), and, subsequently, the module (2) is bent through approximately 90 degrees towards the holder (1), thereby causing bending of the connection pins (4) and, finally, the module (2) is arranged in the clamping member (5).

* * * * *